United States Patent
Patti

(10) Patent No.: US 6,400,612 B1
(45) Date of Patent: Jun. 4, 2002

(54) MEMORY BASED ON A FOUR-TRANSISTOR STORAGE CELL

(75) Inventor: Robert Patti, Warrenville, IL (US)

(73) Assignee: Tachyon Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/802,715

(22) Filed: Mar. 8, 2001

(51) Int. Cl.[7] .................................................. G11C 7/00

(52) U.S. Cl. .................................. 365/187; 365/189.01

(58) Field of Search ........................... 365/187, 189.01, 365/230.01

(56) References Cited

U.S. PATENT DOCUMENTS 5,764,571 A * 6/1998 Banks ..................... 365/189.01

* cited by examiner

Primary Examiner—Terrell W. Fears
(74) Attorney, Agent, or Firm—Calvin B. Ward

(57) ABSTRACT

A memory organized as a two-dimensional array of data storage cells having a plurality of rows and columns. Each data storage cell has first, second, third, and fourth terminals, each data storage cell sinking a current between the first and second terminals indicative of a charge stored therein when the third terminal is at a first potential. The memory has a plurality of bit lines, one corresponding to each column. The first terminal of each data storage cell in each column is connected to the bit line corresponding to that column when the third terminal is at the first potential and each data storage cell is disconnected from that bit line when the third terminal is at a second potential. The memory also includes a plurality of column select lines and row select lines. There is one column select line corresponding to each column and one additional column select line adjacent to either the first or last column. The fourth terminal of each data storage cell in each column is connected to the column select line corresponding to that column. Similarly, there are row select lines, one corresponding to each row, the third terminal of each data storage cell in each row being connected to the row select line corresponding to that row. The second terminal of each data storage cell in each column is connected to the column select line of an adjacent column. The charge stored by each data storage cell is determined by the potential difference between the first and second terminals of that data storage cell when the third and fourth terminals of that data storage cell are held at a first potential.

4 Claims, 4 Drawing Sheets

MEMORY BASED ON A FOUR-TRANSISTOR STORAGE CELL

FIELD OF THE INVENTION

The present invention relates to computer memories, and more particularly, to high-speed memories for use in cache memories and the like.

BACKGROUND OF THE INVENTION

Cache memories must run at speeds that match the speed of the CPU. To meet this speed requirement, the memory cells in the cache must have active gain to provide the necessary read speed. Hence, 6 transistor SRAM memory cells are typically used for cache memories. Unfortunately, these memory cells require a large area of silicon to construct. The silicon area is determined by the need to provide two wells per memory cell to accommodate the different types of transistors in the memory cells, as well as the large number of transistors.

Memory cells that require significantly less silicon area are known to the art. For example, conventional DRAM memory cells require only one transistor and one capacitor. However, these cells lack the active gain, and hence, cannot meet the speed requirements. In addition, conventional DRAMs require that data read from a memory cell be re-written, since the read operation removes a significant fraction of the charge stored on the capacitor. Hence, a "read" is actually a "read" followed by a "write". This increases the cycle time further.

A three-transistor memory cell having active gain during the read operation is taught in U.S. Pat. No. 6,141,261, which is hereby incorporated by reference. This patent describes a memory that stores multiple bits per memory cell; however, the same memory cell can store a single bit. While this memory cell has the necessary speed, the memory taught in this patent requires that all bits of each word be written at once. Hence, if only one byte of the word is to be re-written, the contents of the remaining bytes must first be read so that the contents of these memory cells can be re-written when the write operation is performed on the byte that is to be altered. The additional read operation increases the memory write time, and hence, renders the memory unsuitable for cache applications.

Broadly, it is the object of the present invention to provide an improved semiconductor memory.

It is a further object of the present invention to provide a memory having active gain that requires less area than prior art memories.

These and other objects of the present invention will become apparent to those skilled in the art from the following detailed description of the invention and the accompanying drawings.

SUMMARY OF THE INVENTION

The present invention is a memory organized as a two-dimensional array of data storage cells having a plurality of rows and columns. Each data storage cell has first, second, third, and fourth terminals, each data storage cell sinking a current between the first and second terminals indicative of a charge stored therein when the third terminal is at a first potential. The memory has a plurality of bit lines, one corresponding to each column. The first terminal of each data storage cell in each column is connected to the bit line corresponding to that column when the third terminal is at the first potential and each data storage cell is disconnected from that bit line when the third terminal is at a second potential. The memory also includes a plurality of column select lines and row select lines. There is one column select line corresponding to each column and one additional column select line adjacent to either the first or last column. The fourth terminal of each data storage cell in each column is connected to the column select line corresponding to that column. Similarly, there are row select lines, one corresponding to each row, the third terminal of each data storage cell in each row being connected to the row select line corresponding to that row. The second terminal of each data storage cell in each column is connected to the column select line of an adjacent column. The charge stored by each data storage cell is determined by the potential difference between the first and second terminals of that data storage cell when the third and fourth terminals of that data storage cell are held at a first potential. The memory also includes a read circuit for measuring the charge stored in a data storage cell in one of the columns. The read circuit is connected to the bit line corresponding to that column while the column select line corresponding to that column and the adjacent column select line to which the second terminals of the data storage cells in that column are connected. The read circuit applies a potential difference between that bit line and that adjacent column select line while applying the first potential to one of the row select lines. The memory also includes a write circuit for storing charge in the data storage cells in one of the columns. The write circuit is connected to the bit line corresponding to that column, the column select line corresponding to that column and the adjacent column select line to which the second terminals of the data storage cells in that column are connected. The write circuit applies a potential difference indicative of the charge to be stored in a selected one of the data storage cells in that column between that bit line and that adjacent column select line while applying the first potential to one of the row select lines and the column select line corresponding to that column.

DETAILED DESCRIPTION OF THE INVENTION

Figure 1:
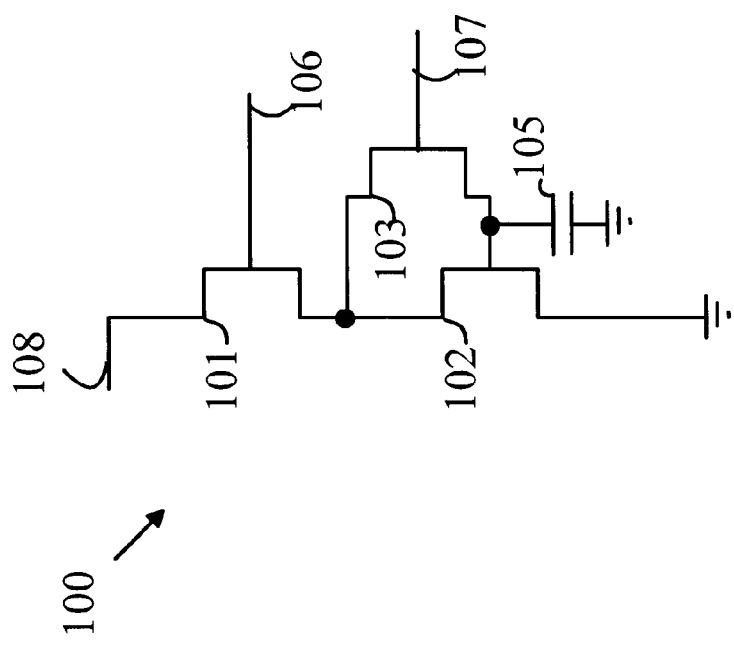
FIG. 1 is a schematic drawing of a three-transistor memory cell 100.

The manner in which the present invention provides its advantages can be more easily understood with reference to FIG. 1, which is a schematic drawing of a three-transistor memory cell 100 of the type described in the above-described U.S. Patent. Memory cell 100 includes transistors 101–103. Transistor 101 acts as an isolation transistor for coupling and decoupling the memory cell from a bit line connected to terminal 108. Data is stored in the memory cell by storing charge on capacitor 105. It should be noted that capacitor 105 may be the parasitic capacitance associated with the gate of transistor 102. The memory cell is read by coupling transistor 102 to a bit line by applying a signal to word select line 106 and then measuring the current sinked by transistor 102. Transistor 102 provides the active gain needed to speed the read operation. Data is written into memory cell 100 by connecting the memory cell to a bit line and placing transistor 103 in a conducting state by applying a signal to write line 107. The signal level on the bit line determines the charge stored on capacitor 105. Transistor 103 provides the active gain needed to speed write operations.

Figure 2:
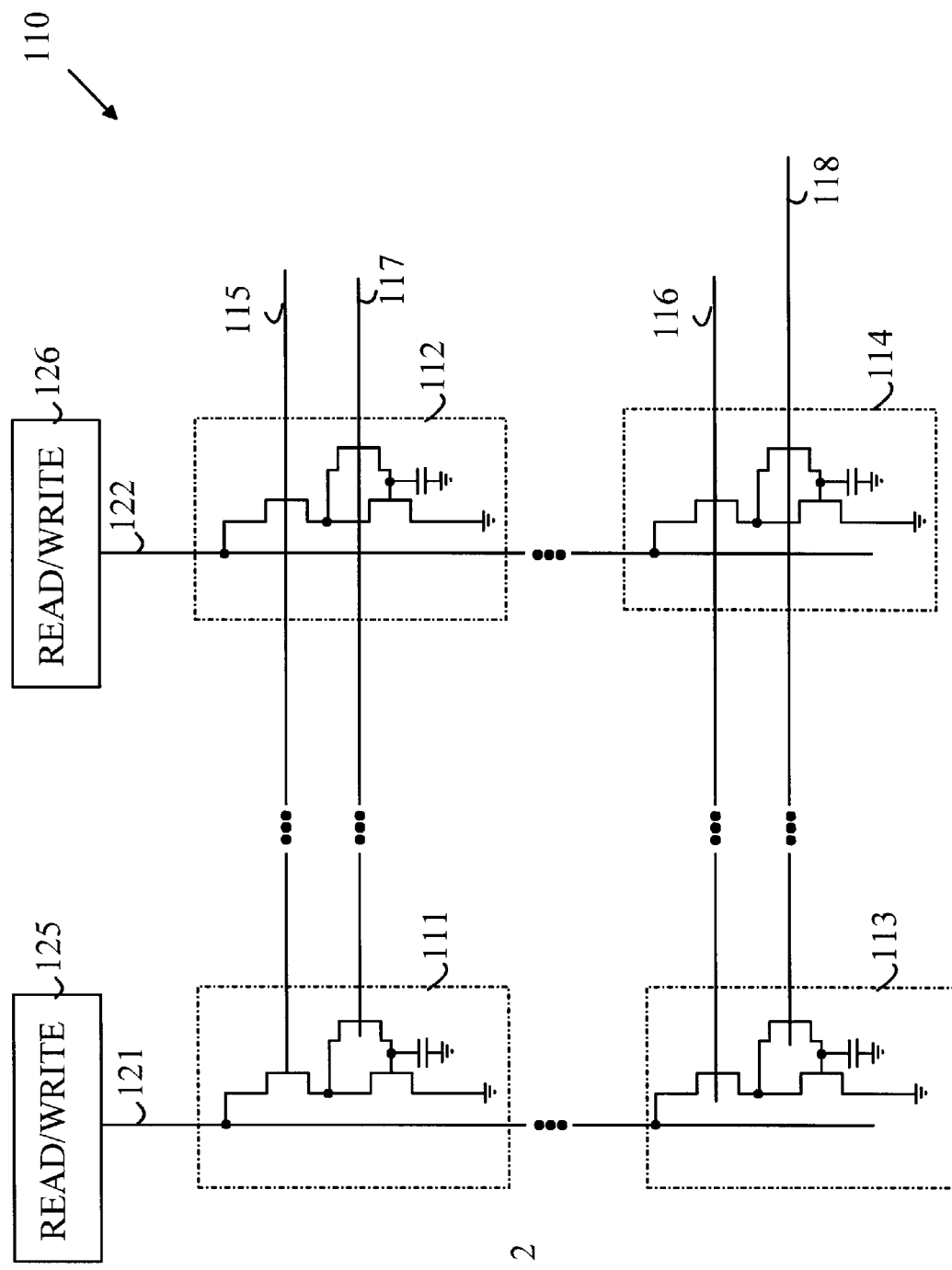
FIG. 2 is a memory for storing and reading data words utilizing the memory cells shown in FIG. 1 at 110.

A memory for storing and reading data words utilizing the memory cells shown in FIG. 1 is shown at 110 in FIG. 2. Memory 110 is constructed from a two-dimensional array of memory cells having a plurality of rows and columns. Exemplary memory cells are shown at 111–114. Each memory cell in a column is connected to a bit line. Exemplary bit lines are shown at 121 and 122. Each bit line is connected to a read/write circuit that controls the bit lines during read and write operations. Exemplary read/write circuits are shown at 125 and 126.

In the embodiment shown in FIG. 2, it is assumed that each memory cell stores only one bit; however, embodiments in which each memory cell stores multiple bits can also be practiced. A memory that stores multiple bits in a similar memory cell is taught in U.S. Pat. No. 6,141,261, issued Oct. 31, 2000; this patent is hereby incorporated by reference. The memory cells in each row store the bits of a "word". A word is selected for reading or writing by applying the appropriate logic level on a word line that is connected to the select transistors in each memory cell in the word. Exemplary word lines are shown at 115–116. Data is written into the bits of a word by applying the appropriate logic levels to both the word line and write line associated with that word while placing the data on the bit lines. Exemplary write lines are shown at 117–118.

The memory shown in FIG. 2 has two shortcomings. First, all of the bits in a word must be written at once, i.e., one cannot write only one bit or byte of a word. As a result, if a portion of a word is to be altered, the contents of the unaltered bits must first be read so that the entire word can be re-written. As noted above, this increases the cycle time of the memory for write operations.

Second, each memory cell must be connected to four conductors, a bit line, a word line, a write line, and ground. As the feature size utilized in the fabrication process decreases, the width of the conductors and the vias connecting the transistors to these conductors become the dominant factor in determining the cell size.

Figure 3:
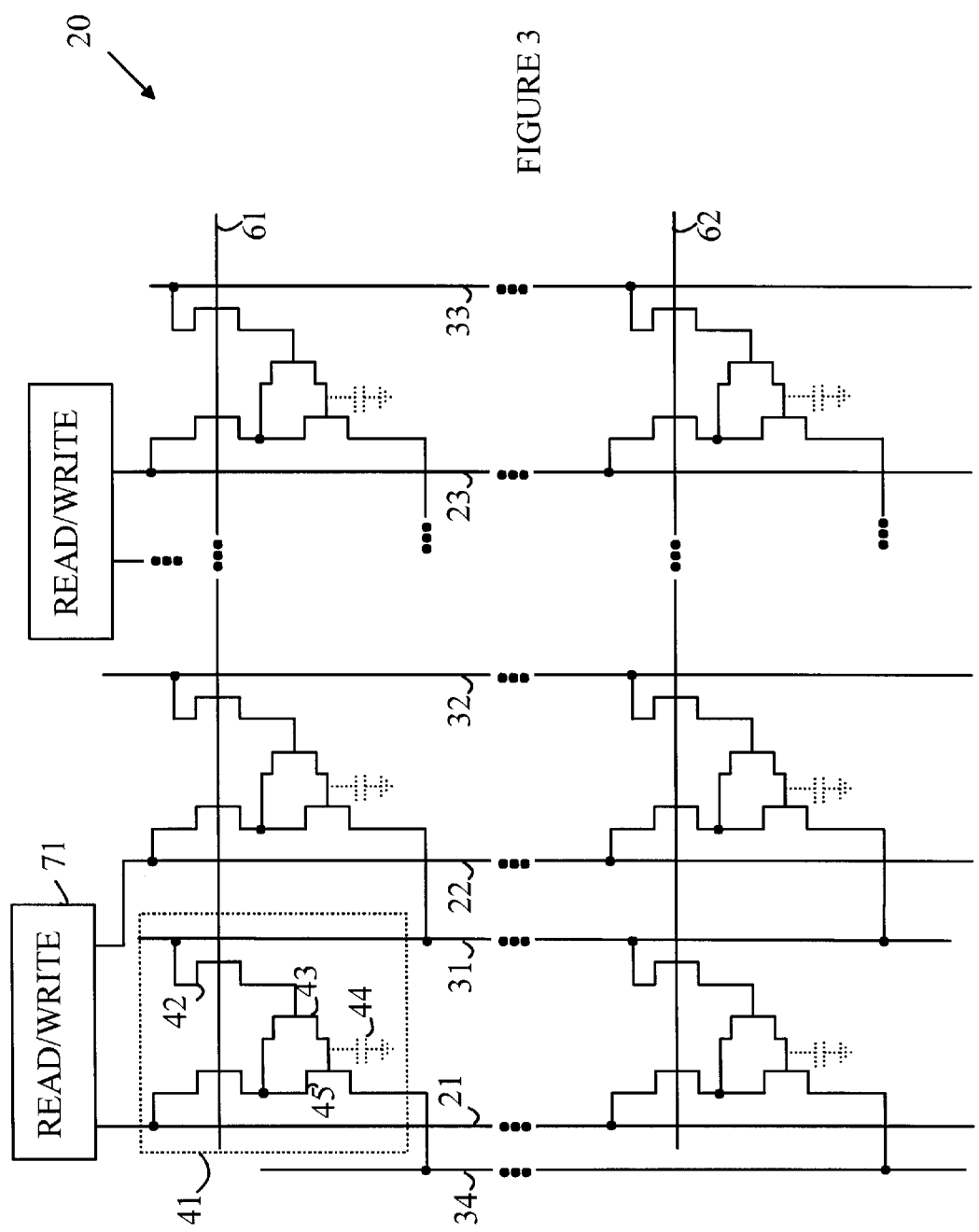
FIGS. 3 is a schematic drawing of a portion of a memory 20 according to the present invention.

The manner in which the present invention overcomes these shortcomings can be more easily understood with reference to FIG. 3, which is a schematic drawing of a portion of a memory 20 according to the present invention. Memory 20 is constructed from a two-dimensional array of memory cells organized as a plurality of rows and columns. An exemplary memory cell is labeled at 41. Memory cell 41 is essentially the memory cell shown in FIG. 1 with an additional transistor 42 that generates the write signal that is applied to transistor 43 in response to a signal on word line 61 and a signal on column select line 31. Hence, individual memory cells can be selected for writing without the need to re-write the memory cells that are not being altered.

The memory cells in each column are connected to a bit line and a column select line. Exemplary bit lines are shown at 21–23, and exemplary column select lines are shown at 31–33. In addition, each memory cell in a column is connected to a corresponding column select line in an adjacent column. One additional "column select line" is provided at the edge of the array and is maintained at ground to provide the ground connections for the last column in the array. This column select line is shown at 34.

In memory 20, capacitor 44 is shown in phantom to indicate that the capacitor function is provided by the parasitic capacitance associated with the gate of transistor 43. However, it should be noted that a capacitor having the gate of transistor 43 as one plate and a second plate constructed from a conductor over the gate can also be utilized without increasing the size of the memory cell. Such capacitor structures are known to those skilled in the DRAM arts, and hence, will not be discussed in detail here.

It should be noted that the drain of transistor 45 is connected to the column select line of one of the adjacent columns rather than to a common ground. When a column is selected for writing by placing the appropriate logic level on the corresponding column select line, the corresponding adjacent column select line is grounded. This sharing of the column select lines allows the present invention to avoid a separate ground connection thereby reducing the number of conductors to which connections must be provided.

Since every other column select line must be grounded during a write, at most, every other bit in a row can be written in a single write cycle. If adjacent bits in a word are to be written at the same time, the memory is organized such that there are two words per row. The odd columns are assigned to the first word, and the even columns are assigned to the second word.

Since only every other column can be written at the same time, each pair of columns can share a single read/write circuit such as read/write circuit 71 thereby reducing the chip area devoted to read/write circuitry. The chip area devoted to such circuitry can be further reduced by utilizing the same read/write circuit for a second memory block located above that shown in FIG. 3. To simplify the drawing, the additional memory blocks have been omitted from FIG. 3. When the data in a row is to be read, the column select lines are all grounded; hence, any number of bits on the selected row can be read in parallel provided there are sufficient read circuits to provide one circuit per bit line.

As noted above, the space occupied by metallic conductors and, more importantly, the vias needed to connect the underlying circuitry to the conductors increases the size of the memory cells. Accordingly, it is advantageous to minimize the number of vias. This can be accomplished by inverting every other memory cell in each column.

Figure 4:
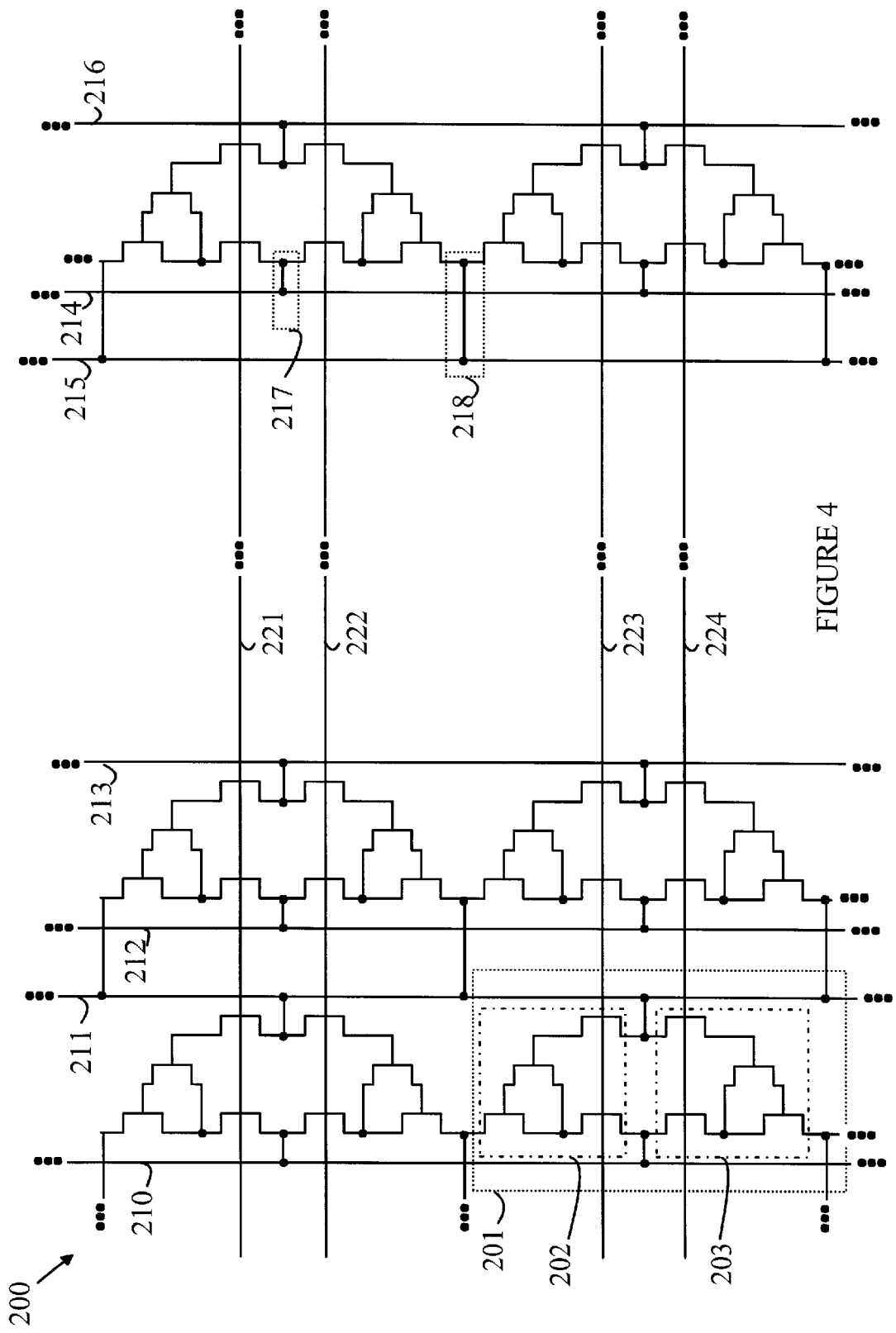
FIG. 4 is a schematic drawing of a portion of a memory 200 in which every other cell is inverted.

Refer now to FIG. 4 which is a schematic drawing of a portion of a memory 200 in which every other cell is inverted. Each column is constructed from a unit cell 201 that consists of two memory cells shown at 202 and 203. To simplify the drawing, the parasitic capacitors have been omitted from the drawing. Each memory cell is connected to a bit line and a column select line. Exemplary bit lines are shown at 210, 212, and 214, and exemplary column select lines are shown at 211, 213, 215, and 216. The bit lines and column select lines are run in metal over the transistors. Vias run from the metal lines to the transistors. Exemplary vias are labeled at 217 and 218. By inverting every other memory cell, it will be seen that each via provides a connection for two memory cells, thereby reducing the number of vias and allowing tighter spacing for the memory cells. In addition, the spacing between the vias on any given vertical conductor is doubled. The word lines shown at 221–224 are preferably run as polysilicon conductors in the silicon substrate, since the word lines do not need to carry any significant current.

The memory cells of the present invention have a read/write time that is much shorter than conventional memory cells because of the active gain provided in the memory cell. As a result, a memory according to the present invention is much faster than the typical bus used to read and write the memory. Accordingly, the memory cells of the present invention can be refreshed between read and write cycles on the bus.

The active gain inherent in the memory cells of the present invention also provides advantages in terms of the read/write circuitry utilized with the memory. A memory cell is read by pre-charging the bit line to which it will be connected and then connecting the bit line and observing the voltage swing on the line. If the storage cell is in a conducting state, the bit line will be drawn down rapidly because the transistor 102 shown in FIG. 1 will pump the charge off of the bit line. Since the voltage swing on the bit line is much faster, the sense amplifiers used in prior art memory designs can be replaced by a simple Schmit trigger, thereby reducing the area needed for the sense amplifier.

Various modifications to the present invention will become apparent to those skilled in the art from the foregoing description and accompanying drawings. Accordingly, the present invention is to be limited solely by the scope of the following claims.

What is claimed is:

1. A memory comprising:

a two-dimensional array of data storage cells organized as a plurality of rows and columns, each data storage cell having first, second, third, and fourth terminals, each data storage cell sinking a current between said first and second terminals indicative of a charge stored therein when said third terminal is at said first potential;

a plurality of bit lines, one corresponding to each column, said first terminal of each data storage cell in each column being connected to said bit line corresponding to that column when said third terminal is at said first potential and each data storage cell being disconnected from that bit line when said third terminal is at a second potential;

a plurality of column select lines, one corresponding to each column and one additional column select line adjacent to either said first or last column, said fourth terminal of each data storage cell in each column being connected to said column select line corresponding to that column; and a plurality of row select lines, one corresponding to each row, said third terminal of each data storage cell in each row being connected to said row select line corresponding to that row, wherein said second terminal of each data storage cell in each column is connected to said column select line of an adjacent column.

2. The memory of claim 1 wherein said charge stored by each data storage cell is determined by the potential difference between said first and second terminals of that data storage cell when said third and forth terminals of that data storage cell are held at a first potential.

3. The memory cell of claim 1 further comprising a read circuit for measuring said charge stored in said data storage cell in one of said columns, said read circuit being connected to said bit line corresponding to that column, said column select line corresponding to that column and said adjacent column select line to which said second terminal of said data storage cells in that column are connected, said read circuit applying a potential difference between that bit line and that adjacent column select line while applying said first potential to one of said row select lines.

4. The memory cell of claim 2 further comprising a write circuit for storing charge in said data storage cells in one of said columns, said write circuit being connected to said bit line corresponding to that column, said column select line corresponding to that column and said column select line to which said second terminal of said data storage cells in that column are connected.

* * * * *